(12) United States Patent
Walcott

(10) Patent No.: US 6,930,496 B2
(45) Date of Patent: Aug. 16, 2005

(54) RANGE RESISTORS FOR AC-DC TRANSFER MEASUREMENTS

(76) Inventor: Henry O. Walcott, 2250 Bigelow Ave., Simi Valley, CA (US) 93065

( * ) Notice: Subject to any disclaimer, the term of this patent is extended or adjusted under 35 U.S.C. 154(b) by 669 days.

(21) Appl. No.: 10/052,865

(22) Filed: Jan. 17, 2002

(65) Prior Publication Data

US 2005/0073327 A1 Apr. 7, 2005

Related U.S. Application Data

(60) Provisional application No. 60/262,242, filed on Jan. 17, 2001.

(51) Int. Cl.[7] .......................... G01R 27/08; G01R 27/28
(52) U.S. Cl. ....................... 324/720; 324/627; 324/72.5
(58) Field of Search ............................... 324/720, 627, 324/72.5, 609; 702/57, 64, 75

(56) References Cited

U.S. PATENT DOCUMENTS 3,612,999 A * 10/1971 Bergero ................... 324/76.41
5,216,373 A * 6/1993 Wakamatsu et al. ........ 324/720

* cited by examiner

*Primary Examiner*—Vincent Q. Nguyen
(74) *Attorney, Agent, or Firm*—J. E. McTaggart

(57) ABSTRACT

A range resistor, for deployment with a low voltage AC measuring instrument as a voltage range multiplying attenuator, provides increased accuracy in the measurement of high AC voltages at frequencies up to 1 MHz, particularly when large attenuation ratios are needed. Passive guarding and neutralizing structure permits the use of higher value resistors for a given frequency response accuracy and an intrinsically lower input capacitance than is obtainable with conventional structure. Very low drift and voltage coefficients are achieved by a coordinated thermal design. Applications include high accuracy voltage measurement in the 10 to 1000 volt range with low input signal current when attenuation is resistively scaled to match the operating input level of the measuring device to be used, typically a thermocouple and/or digital or analog precision voltmeter.

18 Claims, 3 Drawing Sheets

RANGE RESISTORS FOR AC-DC TRANSFER MEASUREMENTS

PRIORITY

Benefit is claimed under 35 U.S.C. § 119(e) of pending provisional application 60/262,242 filed Jan. 17, 2001.

FIELD OF THE INVENTION

The present invention relates to the field of electrical voltage measurements and instrumentation, and more particularly it is directed to improvements in range resistor modules for high accuracy measurement of high AC voltages at high frequencies in conjunction with low voltage measuring instruments, including analog and digital instruments and particularly thermal converters and thermal transfer standard instruments. The invention discloses novel structure in range resistor modules that accomplishes enhanced high frequency compensation by neutralizing stray capacitance to ground distributed along the length of the resistor.

BACKGROUND OF THE INVENTION

Thermoelectric elements first came into use for AC voltage and current measurements in the late 1920's and were first used for AC-DC transfer measurements in the 1940's at the U.S. Bureau of Standards, now NIST. The AC to DC transfer technique has since become widely used in thermal converters and thermal transfer standard measuring instruments for highest level precision measurement and calibration world-wide.

The use of a series resistor to extend the range of a low-voltage voltmeter has been widely practiced for many years. Such a resistor is sometimes termed a "range" resistor because it extends the range of the meter, or a "multiplier" resistor because it in effect multiplies the instrument range usually by a selected integer value, or an "attentuator" because it attenuates the high voltage under measurement to the low voltage of the meter by forming a voltage divider in conjunction with the resistance of the metering instrument.

Multi-meters in common use may contain several or many such range resistors built into the instrument and made selectable by a switch. However for high accuracy laboratory measurements the switch is eliminated as a possible source of error, and instead the range resistor is packaged as a separate module to be connected to the instrument by high quality virtually lossless connectors.

The meter resistance is a key parameter that may be formed at least in part by one or more precision resistors. For purposes of AC to DC comparison techniques for measuring RMS or heating effect of AC voltages especially those with non sinusoidal waveform, this "meter" or load resistance may be formed at least in part by a special thermocouple or other thermoelectric load, which may present a load resistance that is much lower than the resistance of the measuring circuit or meter.

Since a thermocouple is sensitive only to the mean square heating effect of the applied voltage or current, its output response is virtually independent of the waveform of the applied input voltage or its frequency. The device is therefore very useful for AC-DC transfer measurements because it responds nearly equally to DC and to the RMS value of AC current.

A thermal element with a single thermocouple can typically develop a 10 millivolt output with an input current of 5 to 10 milliamperes full scale, depending on the device, but is limited to not less than one half of the full scale input to maintain good resolution, due to the square law transfer function of the heater element.

The thermocouple heating element operates at a low voltage, typically 0.5 to 1.0 volt, necessitating the use of a range resistor in series to measure higher voltages in the range of tens to thousands of volts.

DISCUSSION OF RELATED KNOWN ART

As previously noted, significant errors encountered in making high voltage thermal transfer measurements can be due to shortcomings commonly encountered in the characteristics of conventional range resistors, such as (1) irregularity and rolloff in high frequency response resulting from effects of the distributed stray capacitance between the resistor body and the grounded metal enclosure, (2) frequency response errors due to internal capacitance and inductance, (3) changes in voltage coefficient due to variations in operating voltage level, temperature and frequency and (4) instability of amplitude and changes in AC-DC difference due to external and internal changes in temperature.

At the typically low ohms-per-volt levels of thermoelectric devices in common use, frequency response errors are small for voltages under 100 volts and frequencies up to about 50 kHz, because the resistors required are of relatively low value with a maximum of about 20 k ohms. Above 100 volts, the proportionately higher resistor values required cause the effect of distributed stray capacitance between the resistor body and the grounded case to become increasingly significant, resulting in a progressively increased rolloff in high frequency response. The rolloff characteristic has been partially compensated for in the prior art by adding capacitance across the resistor in the form of a moveable shielding ring or sleeve connected to the input. This method, as can be shown cannot provide perfect response compensation because the simple lumped capacitance it adds across the resistor cannot be made exactly equivalent to the distributed stray capacitance between the resistor body and ground.

The ohms-per-volt rating of the converter assembly determines the power dissipation in the resistor, which is very important from a stability standpoint, as dissipation increases as the square of the applied voltage. The resulting resistor heat rise can result, over time, in a drift or slow change in resistor value and cause measurement error, particularly in buildup measurements. For example: at 1000 volts, a 5 ma thermocouple (200 ohm-volt) would require a range resistor value of 200 k ohms resulting in a power dissipation of 5 watts. The high levels of power cause resistor heat rise that is difficult if not impossible to fully eliminate in the working environment.

One remedy for reducing these effects in the prior art has been the cumbersome and inconvenient method of forcing compressed air through the cylindrical resistor housing to cool the resistor with generally poor results.

Another major limiting factor in measurement accuracy has been due to the significant amount of current drawn, compared to the voltage measurement level, which necessitates a relatively low ohmic value of range resistor, which in turn imposes a significant burden on the measured signal. The resistive burden, at 5 to 10 milliamperes of operating current, is 200 to 100 ohms-per-volt in addition to the capacitive burden imposed by shunt capacitance response compensation.

Research, beginning in the 1960's to improve sensitivity has resulted in the now relatively mature development of new lower current multi-junction thermal converters which operate at 1 to 2 milliamperes, reducing burden and increasing sensitivity to 500 to 1000 ohms-per-volt while increasing output by up to 10 times. Power dissipation in the associated range resistor is accordingly reduced from one fifth to one tenth the usual amount which reduces temperature rise and allows use of physically smaller and lower wattage resistor elements.

The lower current requirements of the multi-junction thermal converters, dictates the use of correspondingly higher range resistor values. The advantage is in reduced power dissipation and lower burden. The disadvantage of such a higher impedance system is that frequency response rolloff problems become proportionately worse at the higher frequencies because of the increased effect of stray capacitance from the resistor body to the enclosure.

Existing range resistor approaches have been developed, mainly by nationally supported laboratories, over a long period of time. Manufacturers of calibration equipment, such as the Fluke Corp, Guildline and Molt Laboratories have typically followed the basic high voltage measurement approaches developed in government laboratories.

OBJECTS OF THE INVENTION

It is a primary object of the invention is to provide a highly accurate range resistor that is particularly useful for higher attenuation ratios, at "Volt×Hz" products up to 100,000,000, in voltage ranges from 100 to 1000 volts with increased accuracy over known art at AC frequencies as high as 1 MHz.

Another object of the invention is to accomplish an unusually low feed-through and input capacitance, which consequently produces a constant input impedance with a low reactive component to a higher frequency than has here-to-fore been attainable.

An additional object of the invention is to provide a precision attenuator that can utilize up to an order of magnitude higher resistance values than is usual while maintaining the same uniformity and bandwidth of frequency response Yet another object of the invention is to provide a precision attenuator of improved accuracy and stability through a reduction of the temperature rise of the resistive element due to internal heating during operation and thus accomplish a reduction in the time and extent of warm-up drift and drift resulting from level changes, as well as a reduction in measurement errors due to changes in voltage coefficient and frequency response due to changes in resistor temperature.

SUMMARY OF THE INVENTION

The above mentioned advantages and objectives have been accomplished in the present invention through the use of a novel primary shield assembly, containing the range resistor, divided into two portions: a grounded portion and an ungrounded portion insulated from the grounded portion and connected to incoming voltage under test at the input end of the range resistor.

The particular geometry of these shield portions and a specially selected location of the resistor body inside the shield structure, essentially eliminate errors in the signal transfer function due to the effect of stray capacitance from the external grounded shield to the resistor body, where the capacitance, is distributed in a gradient along the length of the resistor body. The high AC voltage under test is also distributed along the length of the resistor in a gradient.

It should be noted that, even where no direct electrical connection exists between the body of the resistor and the enclosing shield, a capacitive current will flow between them, depending on differences in potential and spacing at every point, due to the formation of a complex electrostatic field. The magnitude of current flow is proportional to both voltage differential and frequency and is inversely proportional to spacing between elements. The effect of the capacitive current is to divert a portion of the input current from the output by bypassing it to the shield, causing AC to DC difference error that increases with frequency. The range resistor and surrounding shield may be enclosed within an outer grounded cylindrical shell, with suitable insulation for the ungrounded high voltage portion. The shell is typically perforated for cooling and equipped with connectors on each end, forming a convenient range resistor instrumentation module.

BRIEF DESCRIPTION OF THE DRAWINGS

The objects and advantages of the present invention will be more fully understood from the following description taken with the accompanying drawings in which.

DETAILED DESCRIPTION

Figures 1, 1A, 1B:
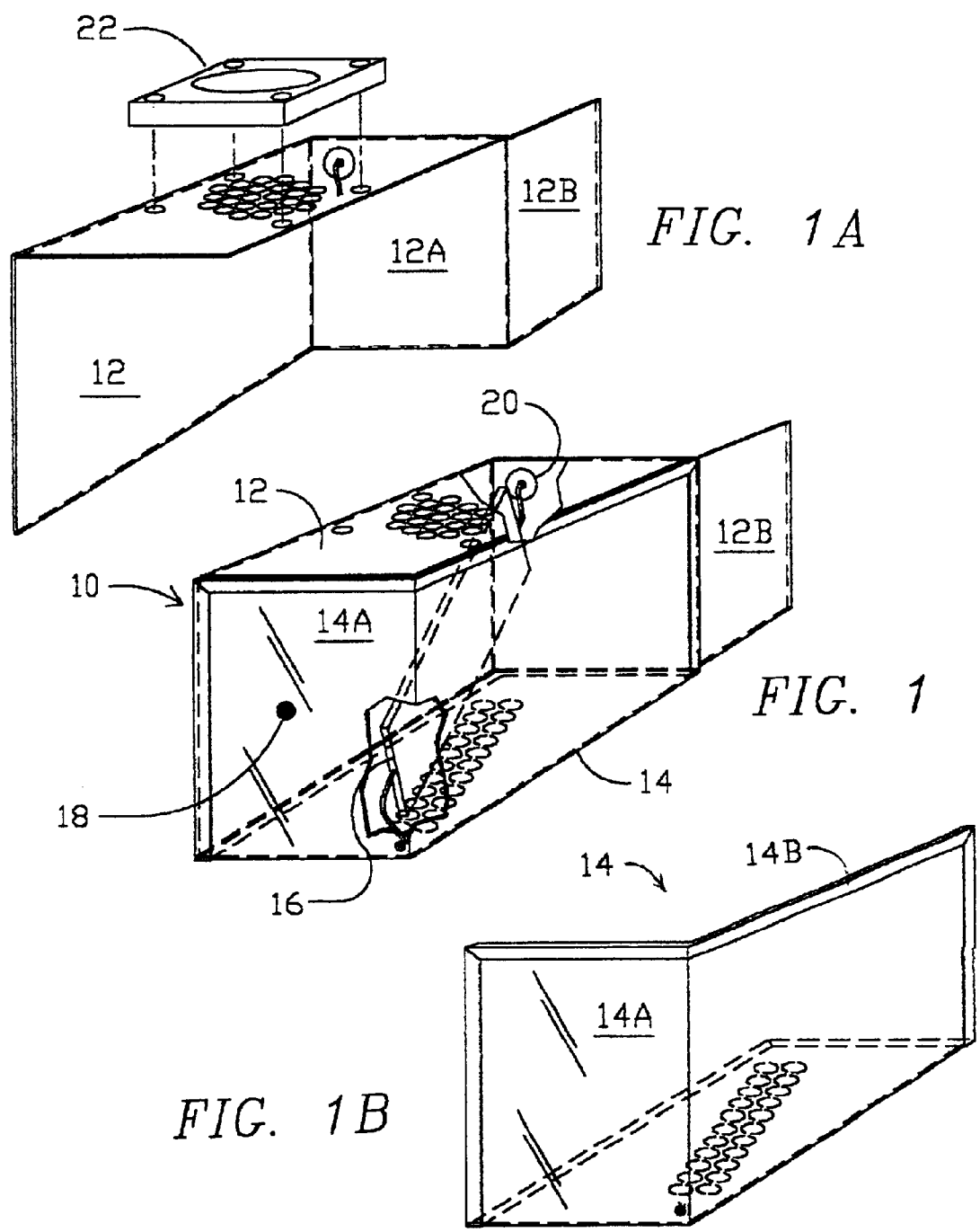
FIG. 1 is a perspective view of a range resistor enclosed in a two-portion primary shield assembly in accordance with an illustrative embodiment of the present invention.
FIG. 1A is perspective view of the grounded portion of the shield enclosure of FIG. 1 along with a cooling fan shown in an exploded displacement.
FIG. 1B is a perspective view of the ungrounded portion of the primary shield assembly of FIG. 1.

FIG. 1 is a perspective view of the primary shield assembly 10 of a high frequency compensated range resistor of the present invention, consisting of a rectangular metal enclosure composed of two mating half portions: a grounded portion 12 and an ungrounded portion 14, the two half portions being insulated from each other by electrical insulation, bonded at their junctions.

Resistor 16, seen in part through a cutaway opening and otherwise shown in hidden lines, is a generally rectangular high quality non-inductive resistor with end leads, and is located in an inclined diagonal orientation in both horizontal and vertical axes as shown, extending between diagonally opposite corners of the shield assembly.

Grounded shield portion 12 includes the top panel, far side panel and far end panel, which has an extension flap 12B extending to the rear.

The ungrounded shield portion 14 includes the near side panel, bottom panel and near end panel 14A which is connected to the near end lead of resistor 16 and is fitted with an input connection 18 for connection to an input receptacle for receiving the applied high voltage signal under test.

The output end of resistor 16 is attached to an insulated feed through terminal 20 mounted in the rear panel of the grounded shield portion 12, to be wired to an output receptacle for connection to the voltmeter instrument.

The physical placement of resistor 16 allows its input end to be directly attached to a position on the ungrounded input shield portion 14, farthest from the grounded output shield portion 12 and allows the output end of resistor 16, conversely, to be positioned as closely as possible to the grounded output shield portion 12, farthest from the signal-carrying ungrounded input shield portion 14. This arrangement therefor results in the placement of the high potential end of the resistor 16 closest to the high potential half of the shield and farthest from the grounded half, and places the low potential end closest to the grounded half and farthest from the high potential half. This unique spacing arrangement reduces the flow of capacitive current from the resistor 16 to the shield at all points along the resistor 14 to an absolute minimum through a positioning whereby stray capacitance is least where the potential difference is greatest and stray capacitance is greatest where the potential difference is lowest.

The effect of the primary shield configuration and the resistor placement within it is not only to minimize the capacitive currents that flow between the resistor and the shield due to the difference in potential at each point between them, but to also neutralize the remaining net value by splitting these currents from the resistor into oppositely phased components that flow to both the separate high potential input signal side and grounded sides of the shield. Since the magnitude of current flow from the resistor 16 to the shield is proportional to the ratio of potential difference to the spacing (e/d), and the end from all parts of the resistor 16 to each half of the shield are made equal, the currents cancel because the flow is equally divided between the oppositely polarized shield halves.

FIG 1A is a perspective view of the grounded shield portion 12, with a fan 22 shown separated from its final mounting location on top of shield portion 12, where there are perforations or other opening provided for air flow; the opening may be circular to match the fan blade size.

FIG. 1B is a perspective view of the ungrounded shield portion 14 including the near end panel 14A, showing a pattern of vent holes in the bottom panel, located diagonally to match the resistor location. Electrical insulation 14B, which may be implemented by a neoprene rubber U-shaped strip, runs along all interfacing edges of the two half portions, and may be bonded to one or both portions.

Figure 2:
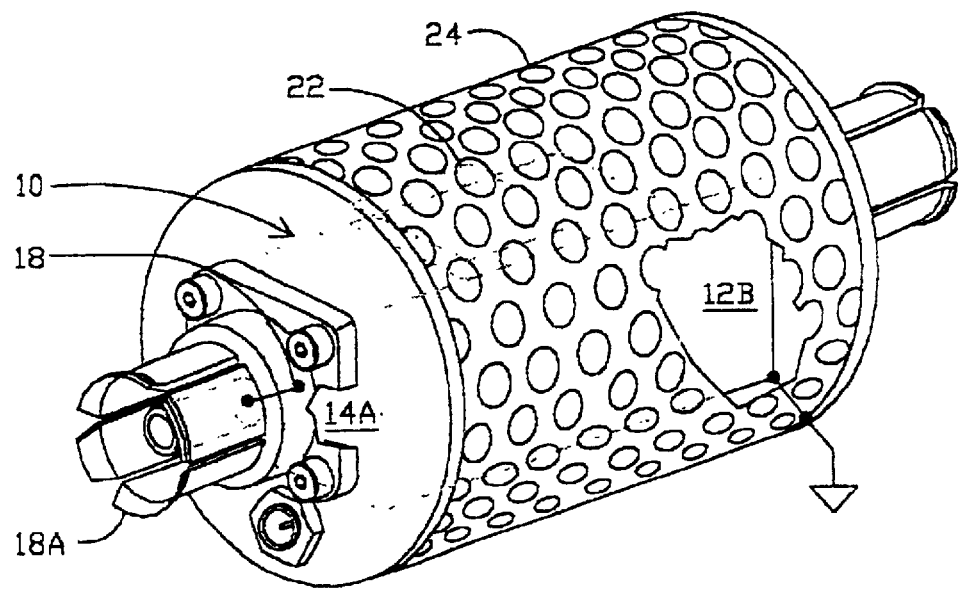
FIG. 2 is a three-dimensional view of range resistor module of the present invention formed by enclosing the subject matter of FIGS. 1, 1A and 1B in an outer shield enclosure with end connectors.

FIG. 2 is a three-dimensional view of a range resistor module of the present invention formed by enclosing the primary shield assembly 10 along with fan 22 of FIG. 1A in an outer shield enclosure 24 including end plates on which are mounted high quality connectors such as connector 18A at the input end with its signal terminal connected to end panel 14A as indicated. The input and output connectors shown are the OR 874 type mounted on acrylic end disks.

Outer shield enclosure 24 is connected to the grounded shield portion 12, as shown in the cutaway region connected to flap 12B of grounded shield portion 12. Electrical insulation of the ungrounded shield portion is provided by insulating concentric rubber rings.

Shown beneath receptacle 18A is the two terminal connector for powering fan 22, typically from low voltage DC, e.g. 5 volts.

The dimensions of a typical module are 10.5 cm long by 6.4 cm in diameter.

Figure 3:
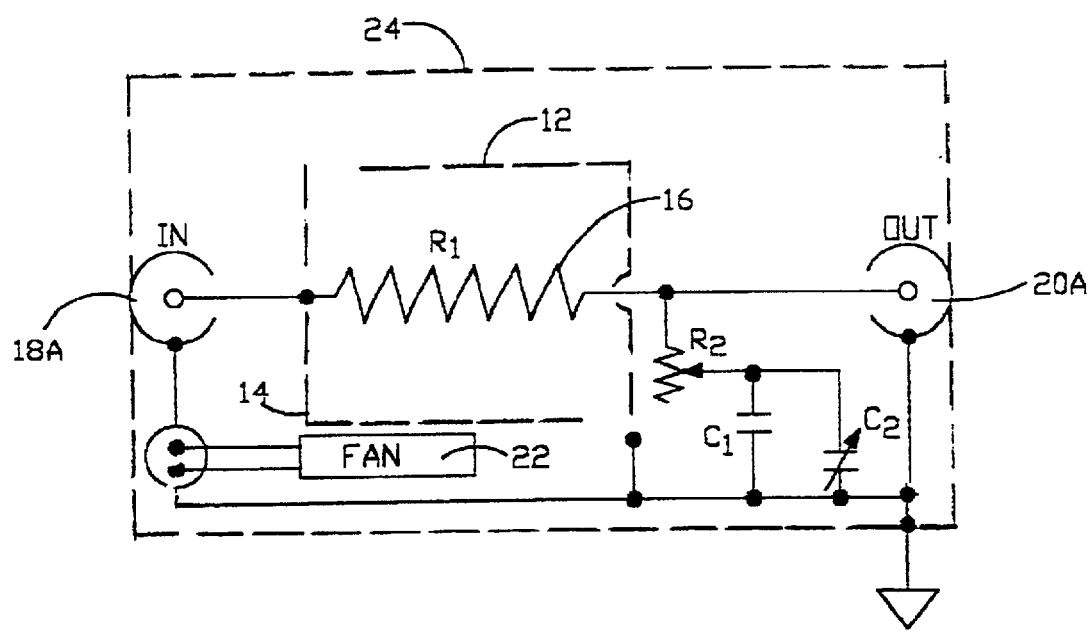
FIG. 3 is a schematic diagram of the module of FIG. 2.

FIG. 3 is a schematic diagram of the module of FIG. 2 showing resistor 16 (R1) connected between the signal terminals of input receptacle 20A and output receptacle 18B. Shield portions 12 and 14 are shown schematically on opposite sides of resistor 16.

The preferred type of resistor 16 is of the non-inductive film type of thin rectangular cross section having a shunt capacitance in the order of 0.1 to 0.2 pF. and a low temperature coefficient.

A series-connected capacitor C1 and resistor R2 shown connected across the output terminals, may be required to provide compensation for high frequency feed through to the output due to the internal distributed capacitance of the particular type of resistor 16 used.

The addition of a variable trimmer capacitor C2 and making resistor R2 variable provide flexibility in applying such compensation when required. These auxiliary components can be mounted on panel flap 12B (FIGS. 1A and 2), The connector seen beneath input receptacle 18A provides for powering fan 22.

Figure 4:
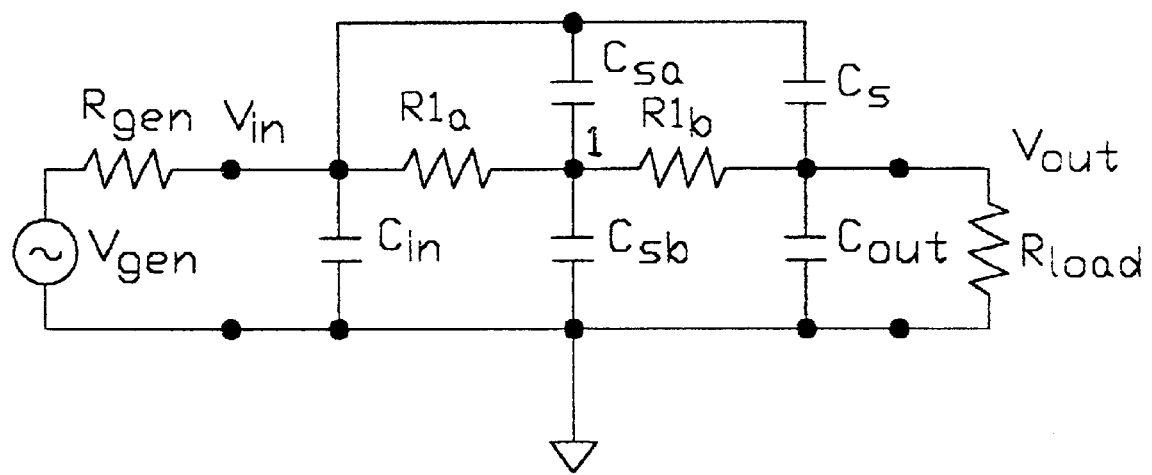
FIG. 4 is a simplified equivalent circuit model of the high frequency compensated range resistor of the present invention as deployed in high voltage measurement.

FIG. 4 is a simplified equivalent circuit model for qualitative analysis of the high frequency compensated range resistor module of the present invention as deployed in high voltage measurement.

The ground node, which includes all grounded elements including both the grounded portion of the inner shield and the grounded outer shield, is represented by the bottom horizontal line of FIG. 4.

The input node which includes the ungrounded shield portion and the input end of the resistor connected to the input, is represented by the upper line in FIG. 4.

The voltage under test, Vin, is generated by a voltage generator Vgen having a source resistance Rgen.

At the input node, the input capacitance Cin, includes all capacitance to ground at the input node; this includes capacitance between the input end region of the resistor and ground, along with capacitance of the input receptacle, any wires or cable connecting the generator, and any capacitance at the generator output terminals.

As a first approximation, Rgen will be considered to be sufficiently small such that the effect of Cin can be neglected.

The range resistor is modeled by dividing its total resistance into two portions R1$a$ and R1$b$; at their junction, node 1 represents a small segment at some point along the length of the range resistor: Csa represents the capacitance of node 1 to the ungrounded shield portion, and Csb represents the unwanted stray capacitance of node 1 to ground, including the grounded shield portion.

Capacitor Cs represents capacitance between the ungrounded shield carrying the input voltage and the output end region of the resistor; in effect this approximates shunt capacitance across the full resistor, mainly a parameter of the range resistor itself.

The output capacitance, modeled by capacitor Cout, includes all capacitance to ground at the output node, including capacitance at the output end region of the resistor, the panel feed-through, the output receptacle, any interconnecting wires or cable and any shunt capacitance added by the voltage measuring instrument in association with the load resistance Rload.

The object of compensation is to neutralize AC currents in the unwanted stray capacitances Csb and Cout that otherwise cause errors due to attenuation at high frequencies.

Neutralization will be accomplished when the capacitive voltage division is equal to the resistive voltage division and the circuit behaves as a balanced bridge where the capacitive loading on the range resistor is eliminated. Cs will neutralize the high frequency loading effect of Cout if the ratio Cout/Cs is made equal to R1/Rload (R1 being R1$a$+R1$b$), and similarly Csa will neutralize the high frequency loading effect of Csb if Csb/Csa is made equal to R1a/(R1b+Rload) for every location of node 1 along the range resistor.

Considering node 1 to be at a midpoint along the range resistor such that for DC and low frequencies the voltage at node 1 is Vin/2. Disregarding Rload as negligibly small, R1a will be equal to R1b, and neutralization will occur if Csa=Csb.

From the physical symmetry of the actual location of the range resistor relative to the grounded and the ungrounded portions of the primary shield assembly, Csa and Csb are inherently made to be substantially equal in capacitance over a substantial mid region of the resistor, thus providing the desired neutralization. Furthermore, the configuration causes Csa to increase and Csb to decrease as node 1 moves toward the input end of the range resistor and conversely causes Csa to decrease and Csa to increase as node 1 moves toward the load end of the range resistor, thus producing an overall pattern of voltage gradient and capacitive gradient for Csa and Cb that interact in a manner favorable to overall neutralization thus accomplishing substantial improvement in accuracy of high frequency high voltage measurement when the range resistor is compensated in this manner.

For comparison with a conventional shielded range resistor, the model can be modified by simply disconnecting the ungrounded shield portions from the input and grounding it along with the grounded portion so that the upper terminal of Csa becomes connected to ground instead of to Vin. Now, not only will Csb act in conjunction with R1a to attenuate or "roll off" high frequencies, but also Csa is now effectively connected in parallel with Csb and would double the shunting capacitance effect and thus double the unwanted high frequency attenuation, with the corresponding loss of accuracy in measuring AC voltages at high frequencies which is inherent in range resistors of known art and which cannot be easily or properly compensated by attempting to adjust Cout/Cs.

A more rigorous analysis could be performed by dividing the range resistor into the largest possible number of small segments each connected to a pair of capacitors corresponding to Csa and Csb, and analyzing the corresponding voltage and capacitance gradients.

In summation, this new and novel technique in shield design and resistor placement within it provides lower input capacitance and substantially eliminates the roll-off and irregular response of conventional range resistor approaches.

The cooling fan 22 shown in FIG. 1A is not essential to basic practice of the invention, however the configuration of the invention makes it easy to incorporate the fan attached to the grounded portion of the inner shield and to provide appropriate ventilation openings. High accuracy of the range resistor is subject to dissipation heating effect due to the inherent temperature coefficient of even a high quality resistor, so it is preferred practice for highest accuracy and repeatability to allow a warm-up settling time for the resistor temperature to stabilize as indicated by monitoring before making the final measurements.

Deployment of ventilating fan 22 is beneficial in reducing the warm-up settling time, instability and measurement error without affecting the resistor-to-shield capacitance neutralization feature.

The basic principle of the invention, i.e. neutralizing capacitance of the resistor to ground by introducing a corresponding counter-capacitance from a shield portion connected to the input, can be practiced with the inner shield divided in other ways as alternative to the configuration disclosed as the illustrative embodiment. The shield portion could be formed by conductive regions affixed to a non-conductive base or substrate material, and many special divisions and patterns of the shield in grounded and non-grounded portions would enable the principle of the invention to be practiced beneficially.

While the utilization of portions of the primary shield assembly to provide neutralizing capacitance instead of discrete capacitors is elegant and cost effective, the principle of the invention could be practiced with the addition of one or more discrete capacitors to form some portion of the total capacitance, for example to augment the internal capacitance appearing across the resistor.

The invention can be practiced utilizing a resistor of different type and/or shape than the rectangular shape shown, for example it could be cylindrical.

Although the diagonal location of the resistor within the primary shield assembly is recommended and believed to be optimal, the invention can be practiced to advantage with other resistor locations in the primary shield assembly, for which modifications in the primary shield portions and/or compensation trimming components may be required.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. A method for enhancing high voltage AC measurement accuracy at high frequencies, in a measuring system wherein a multiplier resistor having an elongated body, with an input end receiving high AC voltage under test, is deployed in series with an input terminal of a low voltage measuring instrument, comprising the steps of:
providing a primary shield assembly, surrounding the resistor, having an ungrounded conductive portion;
connecting the ungrounded conductive portion of the primary shield assembly to the input end of the resistor receiving the high AC voltage under test; and
configuring and locating the ungrounded conductive portion of the primary shield assembly relative to the resistor in a manner to enhance AC voltage measurement accuracy at high frequencies by virtue of high frequency compensation of the resistor through neutralization of stray capacitance to ground provided by a resultant pattern of voltage and capacitance gradients along the body of the resistor.

2. A frequency-compensated range resistor module for deployment in conjunction with a low-voltage measuring instrument having an input terminal and a ground terminal, to enable measurement of high AC voltages at high frequencies with unusually high accuracy and stability, comprising:
a substantially non-inductive resistor having an elongate body of designated length with connecting means at opposite ends and having a designated resistance value to act in conjunction with the measuring instrument as a required voltage multiplier;
a primary shield assembly of electrically-conductive material, surrounding the resistor, divided into two portions that are electrically insulated from each other:
an ungrounded portion electrically connected to a first end of said resistor designated as the input end, and a ground portion electrically connected to the ground terminal of the measuring instrument;

electrical connector means providing electrical connection between the input end of the resistor and a high voltage under test: and electrical connector means providing electrical connection between a second and opposite end of the resistor, designated as the output end, and the input terminal of the measuring instrument;

the two portions of the primary shield assembly being proportioned, dimensioned and arranged in a manner to enhance AC voltage measurement accuracy at high frequencies by virtue of high frequency compensation provided by a resultant pattern of capacitance between each portion of the primary shield assembly and the body of the resistor creating a favorable combination of capacitive and AC voltage gradient distributed along the length of the body of the resistor.

3. The frequency-compensated range resistor module as defined in claim 2 wherein the primary shield assembly is rectangular in shape and comprises;

a first end panel, a first side panel and a bottom panel formed integrally to constitute the ungrounded portion of the primary shield assembly, connected to the input end of the resistor and thus receiving the high voltage under test;

a second end panel, a second side panel and a top panel formed integrally to form the grounded portion of the primary shield assembly, provided with connector means to be grounded to the ground terminal of the measuring instrument; and electrical insulating means for preventing unwanted contact between the ungrounded portion and the grounded portion of the primary shield assembly.

4. The frequency-compensated range resistor module as defined in claim 3 wherein the resistor is located in an inclined disposition extending diagonally within the primary shield assembly with the input end of the resistor located in the ungrounded portion of the primary shield assembly in a corner thereof formed by the first end panel, the first side panel and the bottom panel, and the output end of the resistor located in the grounded portion of the primary shield assembly in a corner thereof formed by the second end panel, the second side panel and the top panel, the two corners being located diagonally opposite each other in the primary shield assembly.

5. The frequency-compensated range resistor module as defined in claim 4 further comprising:

an electrically energized cooling fan mounted onto the primary shield assembly; and a system of ventilation openings configured in the primary shield assembly located so as to enable the cooling fan to provide a substantial flow of cooling air flow past the resistor.

6. The frequency-compensated range resistor module as defined in claim 4 further comprising:

a compensating network branch, including at least one capacitor and a resistor connected in series, connected between the output end of the resistor and the grounded portion of the primary shield assembly, wherein resistance and capacitance values are optimized for high frequency measurement accuracy.

7. The frequency-compensated range resistor module as defined in claim 4 further comprising:

an electrically conductive outer shield assembly surrounding the primary shield assembly and connected to the grounded portion thereof, including insulating means for preventing the outer shield assembly from contacting the ungrounded portion of the primary shield assembly.

8. The frequency-compensated range resistor module as defined in claim 5 further comprising a mounting flange extending from the first end panel and providing mounting support for components of the compensating network branch.

9. The frequency-compensated range resistor module as defined in claim 5 further comprising:

an electrically conductive outer shield assembly, configured with perforations for cooling air flow, surrounding the primary shield assembly and connected to the ground portion thereof, including insulating means for preventing the outer shield assembly from contacting the ungrounded portion of the primary shield assembly; and first and second end panels of the outer shield assembly each fitted with an electrical connector for input and output respectively.

10. The precision high voltage AC measuring system as defined in claim 5 further comprising:

an electrically conductive outer shield, configured with perforations for ventilation, surrounding the primary shield assembly and connected to the ground portion thereof, including insulating means for preventing the outer shield from contacting the ungrounded portion of the primary shield assembly; and first and second end panels of the outer shield, each fitted with an electrical connector receptacle for input and output respectively.

11. A precision high voltage AC measuring system with enhanced accuracy at high frequencies, comprising:

a low-voltage measuring instrument having an input terminal and a ground terminal;

a substantially non-inductive resistor of designated resistance, with an elongated body, to act in conjunction with the measuring instrument as a required voltage multiplier, having an input end connected to a high voltage under test and an output end connected to the input terminal of the low-voltage measuring instrument; and a conductive surface facing the resistor and acting in the manner of a plate of a capacitor plate of which a second plate is formed by the resistor body, the conductive surface being connected to the high voltage under test and being configured and arranged to provide high frequency compensation of the resistor through neutralization of stray capacitance between the resistor and ground.

12. The precision high voltage AC measuring system as defined in claim 11 further comprising a primary shield assembly, surrounding the resistor, comprising;

a grounded portion facing the resistor and forming a plate of a capacitance gradient pattern distributed along the length of the resistor body;

an ungrounded portion, constituting the conductive surface facing the resistor, connected to the high voltage under test, forming a capacitance gradient pattern distributed along the length of the resistor body;

the grounded portion and the ungrounded portion being configured, dimensioned, located and arranged in a manner to enhance AC voltage measurement accuracy at high frequencies by virtue of high frequency compensation of the resistor through neutralization of stray capacitance to ground provided by a resultant pattern of voltage and capacitance gradients along the body of the resistor.

13. The precision high voltage AC measuring system as defined in claim 12 wherein the primary shield assembly is rectangular in shape and comprises;

a first end panel, a first side panel and a bottom panel formed integrally to constitute the ungrounded portion of the primary shield assembly;

a second end panel, a second side panel and a top panel formed integrally to constitute the grounded portion of the primary shield assembly;

connector means connecting the grounded portion of the primary shield assembly to the ground terminal of the measuring instrument.

14. The precision high voltage AC measuring system as defined in claim 13 wherein the resistor is located in an inclined disposition extending diagonally within the primary shield assembly with the input end of the resistor located in the ungrounded portion of the primary shield assembly in a corner thereof formed by the first end panel, the first side panel and the bottom panel, and the output end of the resistor located in the grounded portion of the primary shield assembly in a corner thereof formed by the second end panel, the second side panel and the top panel, the two corners being located diagonally opposite each other in the primary shield assembly.

15. The precision high voltage AC measuring system as defined in claim 13 further comprising:

an electrically energized cooling fan mounted onto the primary shield assembly; and a system of ventilation openings configured in the primary shield assembly located so as to enable the cooling fan to provide a substantial flow of cooling air flow past the resistor.

16. The precision high voltage AC measuring system as defined in claim 13 further comprising:

an electrically conductive outer shield surrounding the primary shield assembly and connected to the ground portion thereof, including insulating means for preventing the outer shield from contacting the ungrounded portion of the primary shield assembly.

17. The precision high voltage AC measuring system as defined in claim 13 further comprising;

a compensating network branch, including at least one capacitor and a resistor connected in series, connected between the output end of the resistor and the grounded portion of the primary shield assembly, with resistance and capacitance values optimized for high frequency measurement accuracy.

18. The precision high voltage AC measuring system as defined in claim 17 further comprising a mounting flange extending from the first end panel and providing mounting support for components of the compensating network branch.

* * * * *